United States Patent
Sakuma et al.

(10) Patent No.: US 9,633,925 B1
(45) Date of Patent: Apr. 25, 2017

(54) VISUALIZATION OF ALIGNMENT MARKS ON A CHIP COVERED BY A PRE-APPLIED UNDERFILL

(71) Applicant: GLOBALFOUNDRIES INC., Grand Cayman, KY (US)

(72) Inventors: Katsuyuki Sakuma, Fishkill, NY (US); Mukta G. Farooq, Hopewell Junction, NY (US); Jae-Woong Nah, Closter, NJ (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 15/081,403

(22) Filed: Mar. 25, 2016

(51) Int. Cl.
*H01L 23/544* (2006.01)
*H01L 23/31* (2006.01)
*H01L 21/56* (2006.01)
*H01L 21/768* (2006.01)
*H01L 23/29* (2006.01)

(52) U.S. Cl.
CPC ........ *H01L 23/3178* (2013.01); *H01L 21/563* (2013.01); *H01L 21/76864* (2013.01); *H01L 23/29* (2013.01); *H01L 23/544* (2013.01); *H01L 2223/54426* (2013.01); *H01L 2223/54453* (2013.01)

(58) Field of Classification Search
CPC . H01L 2224/11015; H01L 2224/10165; H01L 2224/10135; H01L 2224/81132; H01L 2223/54426; H01L 2223/54433; H01L 21/68; H01L 21/682; H01L 21/563; H01L 23/544
See application file for complete search history.

(56) References Cited

U.S. PATENT DOCUMENTS

| | | | |
|---|---|---|---|
| 6,746,896 B1 | 6/2004 | Shi et al. | |
| 6,902,954 B2 | 6/2005 | Shi | |
| 6,975,040 B2* | 12/2005 | Dower | H01L 23/544 257/797 |
| 7,812,465 B2* | 10/2010 | Lee | H01L 21/561 257/737 |
| 8,008,122 B1 | 8/2011 | Gaynes et al. | |
| 8,193,647 B2* | 6/2012 | Hsieh | H01L 23/544 257/797 |

\* cited by examiner

*Primary Examiner* — Jasmine Clark
(74) *Attorney, Agent, or Firm* — Thompson Hine LLP; Anthony Canale

(57) ABSTRACT

Structures and methods for improving the visualization of alignment marks on an underfill-covered chip. A feature is formed on a chip, and an underfill material is applied to the chip at a wafer level so that the feature is covered the feature. The feature includes a first structural element comprised of a first material and a second structural element comprised of a second material that is electrochemically dissimilar from the first material to provide a galvanic cell effect. Filler particles in the underfill material are caused by the galvanic cell effect to distribute with a first density in a first region over the first structural element and a second region of a second density over the second structural element. The first density in the first region is less than the second density in the second region such that the first region has a lower opacity than the second region.

20 Claims, 3 Drawing Sheets

VISUALIZATION OF ALIGNMENT MARKS ON A CHIP COVERED BY A PRE-APPLIED UNDERFILL

BACKGROUND

The invention relates generally to chip packaging and, more particularly, to structures and methods for improving the ability to visualize alignment marks on an underfill-covered chip.

A chip may be mounted on a packaging substrate to create a chip package. Typically, solder balls or bumps on the component are placed in registration with pads on the packaging substrate and the solder bumps may be subsequently reflowed to create solder joints that join the packaging substrate and chip. The solder joints provide electrical and mechanical interconnections between the packaging substrate and chip, but also create a gap between the packaging substrate and chip.

Filling the open space between solder joints with an underfill material improves the reliability of the electrical and mechanical interconnections, and protects the fragile back-end-of-line (BEOL) chip structure. The presence of the underfill material also discourages moisture-based failure mechanisms potentially causing electrical shorting and component failure and blocks other contaminants from entering the space between the chip and the packaging substrate. The underfill material makes the interconnections fatigue and creep resistant and also permits the package to withstand shock loads from handling, temperature cycling and drop testing with either static or dynamic loads.

A wafer-level underfill (WLUF) process may be used to preapply the underfill material before the chip is joined with a packaging substrate. In an over-bump applied resin (OBAR) process, a filled resin is applied over the bumps of a wafer and dried. The wafer is diced into coated chips, which are individually aligned and joined to a packaging substrate resulting in an underfilled flip chip package.

When bonding a chip to its packaging substrate, the chip and packaging substrate may be aligned relative to each other using alignment marks on the chip and fiducial marks or alignment marks on the substrate. However, the filler content of a pre-applied underfill may render the underfill opaque. When the underfill is pre-applied on the chip, the alignment between the bumps on the chip and the pads on the packaging substrate may be hindered due to the opacity of the filled resin, which may obscure the ability to visualize the alignment marks and even the bumps on the chip.

Structures and methods are needed that improve the ability to visualize alignment marks on an underfill-covered chip.

SUMMARY

In an embodiment of the invention, a structure includes a chip, a feature on the chip, and an underfill material applied to the chip and covering the feature. The feature includes a first structural element comprised of a first material and a second structural element comprised of a second material that is electrochemically dissimilar from the first material to provide a galvanic cell effect. As a result of the galvanic cell effect, the underfill material includes a plurality of filler particles distributed in a first region of a first density over the first structural element and a second region of a second density over the second structural element. The first density in the first region is less than the second density in the second region such that the first region has a lower opacity than the second region.

In an embodiment of the invention, a method includes forming a feature on a chip, and applying an underfill material including a plurality of filler particles at a wafer level to the chip so that the feature is covered. The feature includes a first structural element comprised of a first material and a second structural element comprised of a second material that is electrochemically dissimilar from the first material to provide a galvanic cell effect. The method includes causing, by the galvanic cell effect, the filler particles to distribute with a first density in a first region over the first structural element and a second region of a second density over the second structural element. The first density in the first region is less than the second density in the second region such that the first region has a lower opacity than the second region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
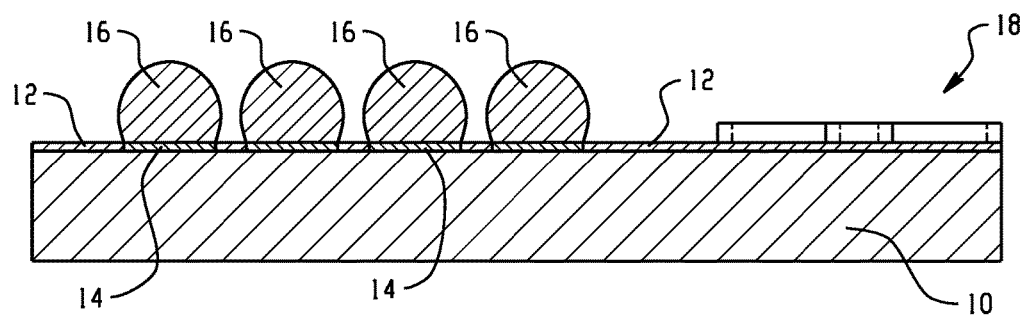
FIG. 1 is a side view in partial cross-section of a chip including an alignment mark in accordance with an embodiment of the invention.
Figure 2:
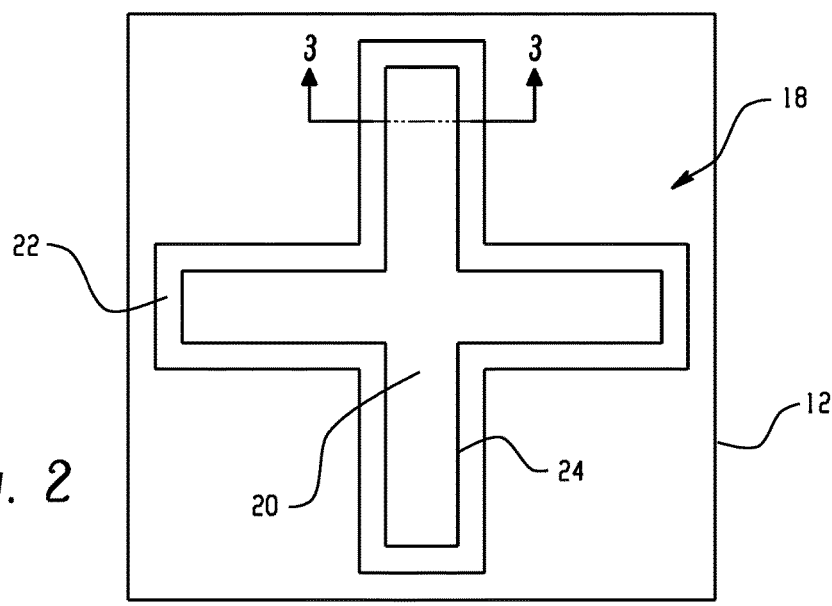
FIG. 2 is a top view of the alignment mark of FIG. 1.
Figure 3:
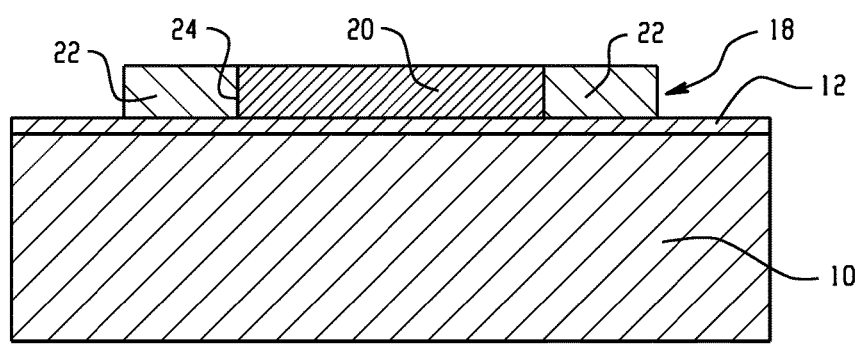
FIG. 3 is a cross-sectional view of taken generally along line 3-3 in FIG. 2.

With reference to FIGS. 1-3 and in accordance with an embodiment of the invention, a chip 10 includes a front side on which integrated circuits have been fabricated with front-end-of-line (FEOL) processes, such as complementary metal-oxide-semiconductor (CMOS) processes, and with middle-of-line and back-end-of-line (BEOL) processes to form an interconnect structure coupled with the integrated circuits. The interconnect structure may include a passivation layer 12, under bump metallurgy (UBM) 14, solder bumps 16, and an alignment mark 18. The solder bumps 16 may be any type of solder balls (e.g., Controlled Collapse Chip Connections or C4 solder balls) that are configured to be reflowed to attach the chip 10 to a substrate or may be replaced by copper pillar-type connections. The under bump metallurgy 14 promotes solder wetting, and/or acts as a solder diffusion barrier. The solder bumps 16 are accessible for establishing electrical connections between the chip 10 and bond pads on a packaging substrate. The packaging substrate to which the chip 10 is attached may be a laminate substrate or a bulk-semiconductor substrate such as silicon, silicon germanium, and multi-layers thereof. The chip 10 may be included among multiple identical chips formed using a wafer, and each of the chips may include the features of chip 10.

As best shown in FIGS. 2 and 3, the alignment mark 18 is a feature that is used to align the chip 10 with a packaging substrate during a chip join process. The alignment mark 18 may be visualized by optical recognition and the information used to align the chip 10 to the packaging substrate before actual chip-to-substrate joining. The alignment mark 18 on chip 10 has a distinctive shape that is relied upon to aid in location and identification in an image of the chip 10. In the representative embodiment, the alignment mark 18 has a cross shape in which structural elements 20, 22 are comprised of a pair of short line segments in which one of the line segments is aligned transverse to and intersects the other of the line segments. However, the structural elements 20, 22 of the alignment mark 18 may have different shapes that are identifiable as a marking that can be used for chip alignment.

The alignment mark 18 is comprised of a plurality of materials rather than a single material, which is conventional. The alignment mark 18 includes structural elements 20, 22 that are disposed with a juxtaposed, directly-contacting relationship in which the structural element 22 defines an outer shape and structural element 20 is located interior of the shape of the structural element 22. As a result of the arrangement, a conductive path exists between the structural elements 20, 22. In the representative embodiment, structural element 20 has an outer boundary 24, and the structural element 22 is arranged at the outer boundary 24. The structural element 22 may extend about the entire perimeter of the structural element 20 at its outer boundary 24.

The alignment mark 18 may be included in the last metal layer of an interconnect structure on the chip 10 that is produced by back-end-of-line (BEOL) processes. The alignment mark 18 may be formed by depositing a layer of the material constituting the structural element 20 and shaping it by photolithography and etching, followed by depositing a layer of the material constituting the structural element 22 and shaping it by photolithography and etching. The alignment mark 18 may be placed on the chip 10 prior to solder bumping that adds the solder bumps 16 and may be located near a dicing channel.

In an embodiment, the alignment mark 18 may include different materials in structural elements 20, 22 that are capable of cooperating to produce a galvanic cell effect. The materials in the structural elements 20, 22 may be electrochemically dissimilar and may have a contacting relationship that provides the conductive path. The electrochemically-dissimilar materials in the structural elements 20, 22 form a bimetallic couple because of their different affinities (i.e., attraction) for electrons. These different affinities may create an electrical potential between a negatively-charged anode defined by one of the structural elements 20, 22 and a positively-charged cathode defined by the other of the structural elements 20, 22. In an embodiment, the electrochemically-dissimilar materials may be selected such that structural elements 22 is negatively charged and structural element 20 is positively charged.

Candidate materials include, but are not limited, to gold (Au), silver (Ag), nickel (Ni), tin (Sn), and aluminum (Al). Candidate pairs of materials include, but are not limited, gold and copper, copper and tin, or any other pair of metals that exhibits a sufficient anodic index. The anodic index is parameter that measures the electrochemical voltage that will be developed between a given metal and gold. For example, the absolute value of the anodic index for copper relative to gold is 0.35 volts, and the absolute value of the anodic index for tin relative to gold is 0.65 volts. The electrochemical voltage of a particular pair of metals is calculated by subtracting their respective anodic indices as referenced relative to the same metal (i.e., gold). The metal with the higher absolute value of the anodic index will become negatively charged relative to the metal with the lower absolute value of the anodic index.

In a particular embodiment of the alignment mark 18, the structural element 20 of the alignment mark 18 may be comprised of gold and the structural element 22 of the alignment mark 18 may be comprised of copper, which paired combination of gold and copper operates as a galvanic cell with a voltage differential of 0.35 volts. In another particular embodiment of the alignment mark 18, the structural element 20 of the alignment mark 18 may be comprised of gold and the structural element 22 of the alignment mark 18 may be comprised of tin, which paired combination of gold and tin operates as a galvanic cell with a voltage differential of 0.65 volts. In yet another particular embodiment of the alignment mark 18, the structural element 20 of the alignment mark 18 may be comprised of copper and the structural element 22 of the alignment mark 18 may be comprised of tin, which paired combination of copper and tin operates as a galvanic cell with a voltage differential of 0.30 volts.

Figure 4:
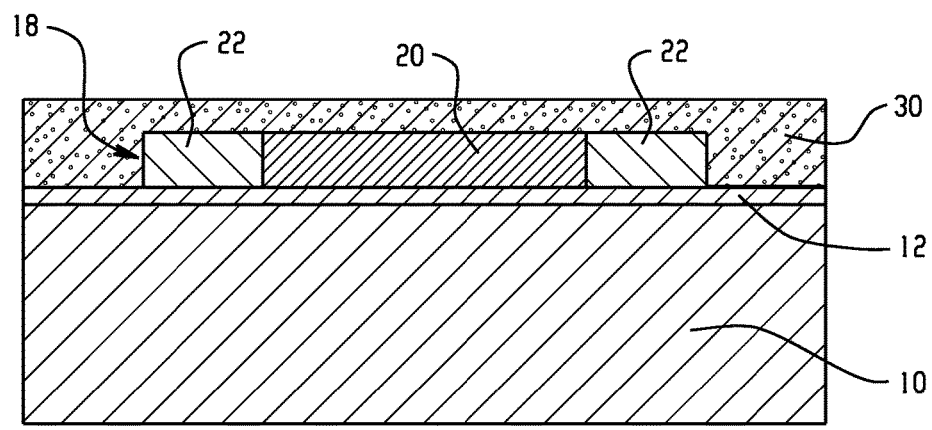
FIG. 4 is a cross-sectional view similar to FIG. 2 in which an underfill material has been applied that covers the alignment mark.
Figure 4A:
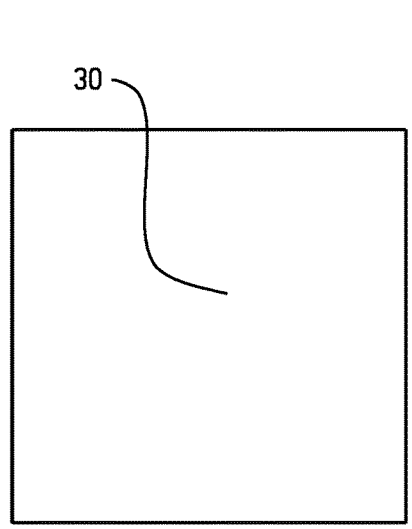
FIG. 4A is a top view of the alignment mark and underfill material of FIG. 4 in which the alignment mark is covered and obscured due to the opaqueness of the underfill material.
Figure 4B:
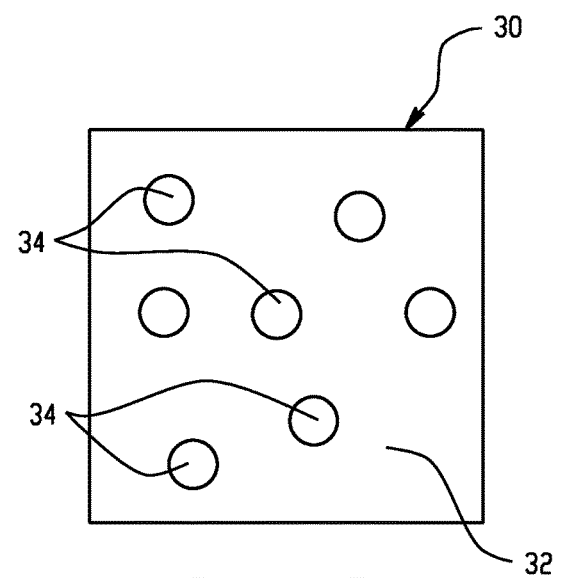
FIG. 4B is an enlarged view of a portion of FIG. 4A in which the filler content contained in the underfill material is visible.

With specific reference to FIGS. 4, 4A in which like reference numerals refer to like features in FIGS. 1-3 and at a subsequent fabrication stage, an underfill material 30 is applied as a layer on chip 10. In particular, the underfill material 30 may be pre-applied to the chip 10 at a wafer level before the solder bumps 16 are reflowed to join the chip 10 to a packaging substrate. Before joining, the underfill material 30 fills the open spaces between the solder bumps 16. The underfill material 30 may be applied with a thickness that is greater than the respective heights of the solder bumps 16 and the alignment mark 18 such that each is covered. However, the thickness of the underfill material may be less than the height of the solder bumps 16 and greater than the height of the alignment mark 18. The underfill material 30 may be applied by, for example, spin-coating as a fluid onto the entire wafer that includes chip 10. Alternatively, the underfill material 30 may be applied by, for example, laminating as a film onto the entire wafer that includes chip 10.

The underfill material 30 may comprise a bulk matrix 32 comprised of, for example, a thermoplastic material that is an electrical insulator and non-conductive. The bulk matrix 32 of the underfill material 30 may include a resin comprised of one or more polymers, as well as additional substances such as initiators, catalysts, cross-linking agents, stabilizers, etc. After the chip 10 is joined to the packaging substrate, the bulk matrix 32 of the underfill material 30 may be hardened by curing to form a cohesive solidified mass.

The underfill material 30 may further include a filler comprised of a plurality of small particles 34 of a material, such as an electrical insulator like silica, glass, alumina, or boron nitride. The filler particles 34 are dispersed with a distribution in the bulk matrix 32. The filler particles 34 distributed in the bulk matrix 32 may function to improve the mechanical properties of the cured underfill material 30 and/or to increase the thermal conductivity of the underfill material 30. In an embodiment, the underfill material 30 may comprise a filled over bump applied resin (OBAR).

The filler particles 34 have a higher optical opacity than the bulk matrix 32 and may be uniformly dispersed within the bulk matrix 32 when dispensed onto the chip 10. The filler particles 34 may also be electrostatically charged to have a net positive charge. The content of filler particles 34 in the underfill material 30 is capable of limiting the transparency of the underfill material 30, particularly for high filler contents. For example, at the instant of application, the filler content in the underfill material 30 covering the alignment mark 18 may prevent the alignment mark 18 from being visible from a perspective above the chip 10 as needed to optically recognize the alignment mark 18 to align the chip 10.

Figure 5:
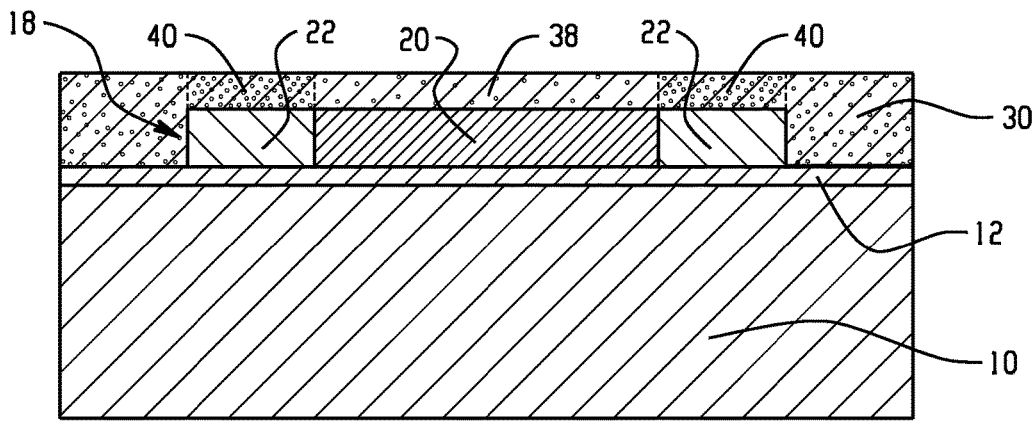
FIG. 5 is a cross-sectional view similar to FIG. 4 in which the underfill material covering the alignment mark has been modified to locally reduce its opacity.
Figure 5A:
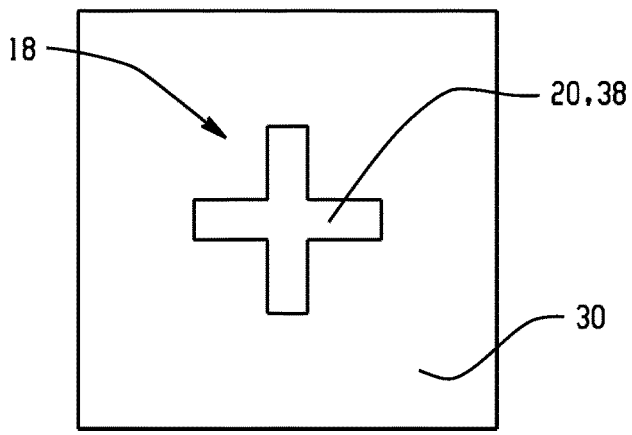
FIG. 5A is a top view of the alignment mark and underfill material of FIG. 4.

With specific reference to FIGS. 5, 5A in which like reference numerals refer to like features in FIGS. 4, 4A and at a subsequent fabrication stage, the construction of the alignment mark 18 is effective to locally reduce the opacity (i.e., increase the transparency or translucency) of the underfill material 30 in the applied layer thickness, after its application, such that the alignment mark 18 becomes visible from a perspective above the chip 10. The existence of the galvanic cell effect produced by the dissimilar materials of the alignment mark 18 is effective to displace the filler particles 34 from the vicinity of the structural element 20 of the alignment mark 18. The positively-charged filler particles 34 within the bulk matrix 32 are repelled away from the structural element 20 of higher potential having a net positive charge and/or are attracted by the structural element 22 of lower potential having a net negative charge.

The displacement of the filler particles 34 reduces the opacity of the underfill material 30, prior to chip join, by creating local transparency or translucency in a region 38 of the underfill material 30 above and near the alignment mark 18. The region 38 of the underfill material 30 characterized by the reduced density of filler particles 34 may be a volume of the underfill material 30 that is located vertically above the inner structural element 20. In particular, the density of filler particles 34 in region 38 is less than a density of filler particles 34 in a region 40 that is outside of the region 38. The region 40 of the underfill material 30 characterized by the increased density of filler particles 34 may be a volume of the underfill material 30 that is located vertically above the outer structural element 22. In the representative embodiment, the dimensions of the region 38 are equal to the dimensions or the structural element 20 and the dimensions of the region 40 are equal to the dimensions or the structural element 22, although the embodiments of the invention are not so limited.

The reduction of the density of filler particles 34 in region 38 occurs after the underfill material 30 is dispensed onto the chip 10, but before the chip 10 is joined to a packaging substrate. In an embodiment, the density reduction may occur shortly after the underfill material 30 is applied at the wafer level to the chip 10. Alternatively, a time delay may be introduced into the process producing the density reduction. The degree of segregation of the filler particles 34 between regions 38, 40 may be influenced by factors including, but not limited to, particle size, the viscosity of the bulk matrix 32, heat applied to reduce the viscosity of the bulk matrix 32, and the magnitude of the galvanic cell effect.

The local area of transparency or translucency improves the ability to locate the alignment mark 18 visually through the underfill material 30, which in turn improves the ability to align the chip 10 relative to another object (e.g., a packaging substrate) in the presence of the otherwise opaque pre-applied underfill material 30, and improves assembly yield in the presence of a pre-applied underfill material 30 with a high filler content.

The density reduction may be assisted by heating the chip 10 to an elevated temperature that causes the bulk matrix 32 to experience a viscosity reduction in comparison with its viscosity during application at room temperature. The lowered viscosity effectively increases the mobility of the filler particles 34 in the bulk matrix 32 under the influence of the electrostatic force applied as a result of the galvanic cell effect. In an embodiment, the chip 10 may be heated to the elevated temperature before the underfill material 30 is dispensed onto the wafer so that the density reduction proximate to the alignment mark 18 occurs shortly after application as the temperature of the underfill material 30 increases toward the temperature of the chip 10. Alternatively, the chip 10 may be heated to the elevated temperature after the underfill material 30 is dispensed onto the wafer so that the density reduction proximate to the alignment mark 18 occurs with a time delay after application.

In an embodiment, the density reduction may be promoted by subjecting the underfill material 30 to an elevated temperature by heating to at least partially cure the underfill material 30 in the course of a normal underfilling procedure to stabilize the underfill material 30 during subsequent operations (e.g., a wafer dicing operation). For example, the underfill material 30 may be at least partially cured to form a semi-solid state, but the underfill material 30 may still be able to be re-melted or further cured with subsequent heating. In that regard, the post-application bake may be performed at a bake temperature that is dependent on the type of underfill material 30 and held for at the bake temperature for a given time (e.g., a range of 150° C. to 170° C. for a time ranging from one hour to two hours).

The ability to change the local transparency or translucency of the underfill material 30 may permit the alignment mark 18 to be placed at other locations on the chip 10 as an alternative to placement at the corner of the chip 10. Relocating the alignment mark 18 to a different location on the chip 10 may represent an attractive alternative to optimize the property improvement provided by the underfill material 30 at the corners of the chip 10.

Figure 6:
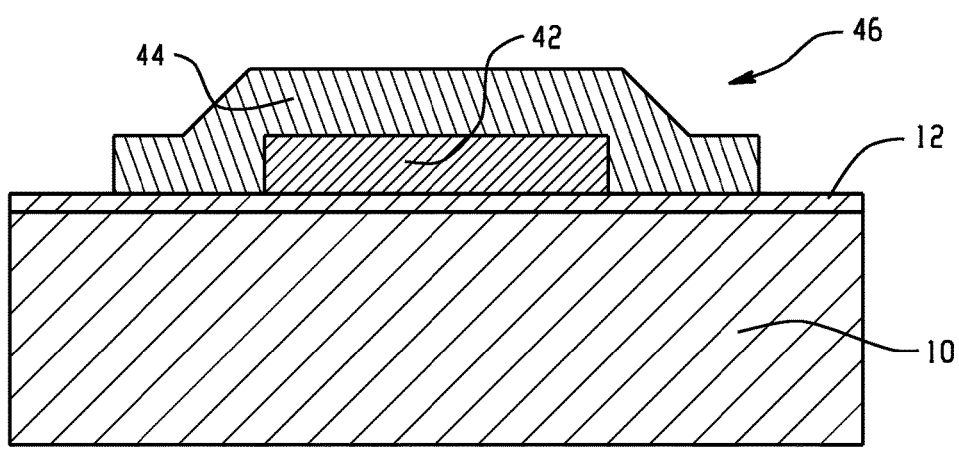
FIG. 6 is a cross-sectional view similar to FIG. 2 that shows an alignment mark in accordance with an embodiment of the invention.

With specific reference to FIG. 6 in which like reference numerals refer to like features in FIG. 5 and in accordance with an alternative embodiment of the invention, the alignment mark 46 includes a structural element 42 and a structural element 44 that has an overlapping relationship with the structural element 44. Rather than the juxtaposed relationship characterizing alignment mark 46, the structural feature 44 covers the structural feature 42 so that the structural feature 42 is located between a portion of the structural feature 44 and the chip 10, as well as being juxtaposed with other portions of the structural feature 44. The structural features 42, 44 are comprised of a combination of materials that are capable of forming a galvanic cell pair. In a particular embodiment of the alignment mark 46, the structural element 42 of the alignment mark 18 may be comprised of copper and the structural element 44 of the alignment mark 18 may be comprised of gold, which paired combination of gold and copper operates as a galvanic cell with a voltage differential of 0.35 volts. The segregation process of the filler content of the underfill material 30 may proceed as described above for the alignment mark 18, other than all or part of the section of structural element 44 overlying structural element 42 will become visible following segregation.

In an alternative embodiment, the structural element 42 may comprise a bond pad instead of an alignment mark. In this instance, the structural element 44 comprises an additional layer that is applied and patterned to have the overlapping relationship with structural element 42. The bond pad may be located on the chip 10 or on the packaging substrate.

In accordance with embodiments of the invention, the structural elements 42, 44 may be used for alignment in a 3D application in which the chip 10 is participating in forming a chip stack including a plurality of chips. In this instance, the underfill material 30 may be applied on the pad side of the chip or packaging substrate instead of the bump side of the chip or packaging substrate.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a chip;
    a feature on the chip, the feature including a first structural element comprised of a first material and a second structural element comprised of a second material that is electrochemically dissimilar from the first material to provide a galvanic cell effect; and
    an underfill material applied to the chip and covering the feature, the underfill material including a plurality of filler particles distributed in a first region of a first density over the first structural element and a second region of a second density over the second structural element,
    wherein the first density in the first region is less than the second density in the second region such that the first region has a lower opacity than the second region.

2. The structure of claim 1 wherein the feature is an alignment mark.

3. The structure of claim 2 wherein the alignment mark includes a first linear segment and a second linear segment that extends transversely across the first linear segment, and the first linear segment and the second linear segment are each comprised of the first material and the second material.

4. The structure of claim 2 wherein the first structural element has an outer boundary, and the second structural element is arranged at the outer boundary.

5. The structure of claim 4 wherein the second structural element extends about an entire perimeter of the first structural element at the outer boundary.

6. The structure of claim 4 wherein the first structural element and the second structural element are arranged in a contacting arrangement.

7. The structure of claim 1 wherein the first structural element feature has an overlapping relationship with the second structural element.

8. The structure of claim 1 wherein the first material has a first anodic index and the second material has a second anodic index that is different from the first anodic index.

9. The structure of claim 8 wherein the first material is gold and the second material is copper.

10. The structure of claim 8 wherein the first material is copper and the second material is tin.

11. The structure of claim 8 wherein an absolute value of the first anodic index is lower than an absolute value of the second anodic index.

12. The structure of claim 1 wherein the first structural element and the second structural element are in a contacting arrangement that defines a conductive path.

13. A method comprising:
    forming a feature on a chip, the feature including a first structural element comprised of a first material and a second structural element comprised of a second material that is electrochemically dissimilar from the first material to provide a galvanic cell effect;
    applying an underfill material including a plurality of filler particles at a wafer level to the chip so that the feature is covered; and
    causing, by the galvanic cell effect, the filler particles to distribute with a first density in a first region over the first structural element and a second region of a second density over the second structural element,
    wherein the first density in the first region is less than the second density in the second region such that the first region has a lower opacity than the second region.

14. The method of claim 13 wherein the underfill material is applied before the chip is joined with a packaging substrate.

15. The method of claim 13 wherein the underfill material has a viscosity, and further comprising:
    elevating a temperature of the underfill material to reduce the viscosity.

16. The method of claim 15 wherein the chip is heated before the underfill material is applied, and the temperature of the underfill material is elevated by the heated chip.

17. The method of claim 15 wherein the chip is heated at after applying the underfill material to elevate the temperature of the underfill material.

18. The method of claim 13 wherein the first material has a first anodic index and the second material has a second anodic index with an absolute value that is different from an absolute value of the first anodic index.

19. The method of claim 18 wherein the first material is gold and the second material is copper.

20. The method of claim 18 wherein an absolute value of the first anodic index is lower than an absolute value of the second anodic index.

* * * * *

UNITED STATES PATENT AND TRADEMARK OFFICE
CERTIFICATE OF CORRECTION

PATENT NO. : 9,633,925 B1  
APPLICATION NO. : 15/081403  
DATED : April 25, 2017  
INVENTOR(S) : Katsuyuki Sakuma Page 1 of 1

It is certified that error appears in the above-identified patent and that said Letters Patent is hereby corrected as shown below:

Column 9, Claim 17, Line 1:
After "heated", remove --at--

Signed and Sealed this
Twenty-seventh Day of June, 2017

Joseph Matal
*Performing the Functions and Duties of the*
*Under Secretary of Commerce for Intellectual Property and*
*Director of the United States Patent and Trademark Office*